(12) United States Patent
Yamamoto et al.

(10) Patent No.: US 11,152,157 B2
(45) Date of Patent: Oct. 19, 2021

(54) STACKED ELECTRONIC COMPONENT AND METHOD FOR MANUFACTURING STACKED ELECTRONIC COMPONENT

(71) Applicant: Murata Manufacturing Co., Ltd., Kyoto (JP)

(72) Inventors: Issei Yamamoto, Kyoto (JP); Kunihiro Miyahara, Kyoto (JP); Yoshihito Otsubo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/683,857

(22) Filed: Nov. 14, 2019

(65) Prior Publication Data

US 2020/0082990 A1 Mar. 12, 2020

Related U.S. Application Data

(63) Continuation of application No. PCT/JP2018/018466, filed on May 14, 2018.

(30) Foreign Application Priority Data

May 15, 2017 (JP) .............................. JP2017-096244

(51) Int. Cl.
*H01G 4/40* (2006.01)
*H03H 7/01* (2006.01)
(Continued)

(52) U.S. Cl.
CPC ........... *H01G 4/40* (2013.01); *H01F 17/0013* (2013.01); *H01F 27/36* (2013.01); *H01G 2/24* (2013.01);
(Continued)

(58) Field of Classification Search
CPC ......... H03H 2001/0085; H03H 7/0115; H03H 7/01; H01G 2/24; H01G 4/40
(Continued)

(56) References Cited

U.S. PATENT DOCUMENTS

| 2006/0158827 | A1 | 7/2006 | Lee et al. | |
| 2011/0090665 | A1* | 4/2011 | Korony | H01C 1/148 361/821 |
| 2013/0341080 | A1 | 12/2013 | Otsubo | |

FOREIGN PATENT DOCUMENTS

| CN | 1808649 A | 7/2006 |
| CN | 103460818 A | 12/2013 |

(Continued)

OTHER PUBLICATIONS

International Search Report for International Application No. PCT/JP2018/018466, dated Jul. 24, 2018.
(Continued)

*Primary Examiner* — Rakesh B Patel
(74) *Attorney, Agent, or Firm* — Pearne & Gordon LLP

(57) ABSTRACT

Provided is a stacked electronic component having: a stacked body 1 in which ceramic layers 1a to 1h are stacked, the stacked body having an a upper surface U and side surfaces S; at least one recess portion 8 formed on the upper surface U that indicates at least one of a mark, a letter, or a number; electrodes 3, 4, 5, 6 formed between the layers of the stacked body 1; and a shield layer 9 formed on the upper surface U and the side surfaces S of the stacked body 1. Right below an inner bottom surface of the recess portion 8 of the stacked body 1, there is provided a no-electrode region NE in which the electrodes 3, 4, 5, 6 are not formed, the no-electrode region NE having a thickness which is equal to or larger than a depth of the recess portion 8.

15 Claims, 10 Drawing Sheets

(51) Int. Cl.
*H01F 27/36* (2006.01)
*H01G 4/12* (2006.01)
*H01G 4/30* (2006.01)
*H01G 2/24* (2006.01)
*H01F 17/00* (2006.01)
*H03H 1/00* (2006.01)

(52) U.S. Cl.
CPC .............. *H01G 4/12* (2013.01); *H01G 4/30* (2013.01); *H03H 7/1741* (2013.01); *H03H 2001/0085* (2013.01)

(58) Field of Classification Search
USPC .................................................. 333/175, 185
See application file for complete search history.

(56) References Cited

FOREIGN PATENT DOCUMENTS

| | | |
|---|---|---|
| JP | H06-244058 A | 9/1994 |
| JP | 2004-273875 A | 9/2004 |
| JP | 2005-057201 A | 3/2005 |
| JP | 2006-203165 A | 8/2006 |
| JP | 2007-242806 A | 9/2007 |
| JP | 2008-016752 A | 1/2008 |
| JP | 2008-264787 A | 11/2008 |
| JP | 2011-018927 A | 1/2011 |
| WO | 2012/132880 A1 | 10/2012 |

OTHER PUBLICATIONS

Written Opinion for International Application No. PCT/JP2018/018466, dated Jul. 24, 2018.

\* cited by examiner

-- Prior Art --

STACKED ELECTRONIC COMPONENT AND METHOD FOR MANUFACTURING STACKED ELECTRONIC COMPONENT

CROSS-REFERENCE TO THE RELATED APPLICATION

This is a continuation of International application No. PCT/JP2018/018466, filed on May 14, 2018, and priority under 35 U.S.C. 119(a) and 35 U.S.C. 365(b) is claimed from Japanese Application No. 2017-096244, filed May 15, 2017; the entire contents of which are incorporated herein by reference.

FIELD OF THE DISCLOSURE

The present disclosure relates to a stacked electronic component having a stacked body in which a plurality of ceramic layers is stacked.

The present disclosure also relates to a method of manufacturing a stacked electronic component suitable for manufacturing the stacked electronic component of the present disclosure.

BACKGROUND

Conventionally, in an electronic component module embedding an IC (Integrated Circuit) element, a shield layer is formed on the outer surface of the electronic component module, so that the IC element does not malfunction due to noise introduced from the outside, and so that the IC element does not emit noise to the outside.

For example, a shield layer is formed on the outer surface of an electronic component module (semiconductor device). FIG. 7 shows an electronic component module (semiconductor device) 1000 of prior art.

The electronic component module 1000 includes a wiring board 101. A plurality of IC elements (semiconductor chips) 102 is mounted on the upper main surface of the wiring board 101. The wiring board 101 and the IC elements 102 are wire-bonded by a wire (signal wire) 103. Further, the IC elements 102 are wire-bonded to each other by the wire 103.

A mold resin 104 is formed on the upper main surface of the wiring board 101 so as to cover the IC elements 102.

A shield layer 105 is formed on the outer surface of the mold resin 104. The shield layer 105 is formed so that the IC element 102 does not malfunction due to noise introduced from the outside, and so that the IC element 102 does not emit noise to the outside.

In the electronic component module 1000, a recess portion (marking) 106 is formed on the upper surface of the mold resin 104 before the shield layer 105 is formed. The recess portion 106 is imprinted by irradiation with laser light and indicates product information such as a product number, a date of manufacture, and a manufacturing factory.

In the electronic component module 1000, the shade of the recess portion 106 is visually read from the upper of the shield layer 105 so as to recognize information such as the product number, the date of manufacture, and the manufacturing factory.

On the other hand, in a conventional stacked electronic component having a stacked body in which ceramic layers are stacked, directional marks are formed on the upper surface of the stacked body so that the stacked electronic component is mounted in the correct direction. In addition to the directional mark, or in place of the directional mark, a product number, a date of manufacture, a manufacturing factory, and the like may be indicated on the upper surface of the stacked body.

SUMMARY

In a stacked electronic component having a stacked body in which ceramic layers are stacked, when forming the recess portion indicating marks, letters, numbers and the like on the upper surface of the stacked body, and forming the shield layer on the outer surface of the stacked body in order to suppress the transmission of noise, the following problems may occur.

First, when a recess portion indicating a mark or the like is to be formed by pushing a convex portion formed on a mold or the like onto the upper surface of an unfired stacked body, there is a problem that an electrode which is formed right below the recess portion might be partially pushed out and plastically deformed, making the electrode disconnected or cracked. Also, when a recess portion indicating a mark or the like is to be formed by irradiation of laser light on the upper surface of the stacked body, there is a problem that an electrode which is formed right below the recess portion might be heated by irradiation of laser light, making the electrode disconnected or cracked.

In addition, there is a problem that the required electrical characteristics may not be obtained due to a stray capacitance occurred between a shield layer formed on the inner bottom surface of the recess portion and the electrode formed in the stacked body.

The present disclosure has been made in order to solve the above problems. A stacked electronic component of the present disclosure includes a stacked body in which a plurality of ceramic layers are stacked to define a bottom surface, an upper surface and a plurality of side surfaces connecting the bottom surface and the upper surface. At least one recess portion indicating at least one of a mark, letter, or number is formed on the upper surface of the stacked body, and an electrode is formed between the layers of the stacked body. The stacked body also includes a shield layer formed on at least one portion of a side surface and at least a portion of the upper surface, the shield layer being formed on at least a portion of an inner bottom surface and an inner wall surface of the recess portion of the stacked body. A no-electrode region in which no electrode is formed is provided right below the inner bottom surface of the recess portion in the stacked body, and a thickness of the no-electrode region is set to be equal to or larger than the depth of the recess portion, the thickness being measured from the inner bottom surface of the recess portion.

The no-electrode region has a thickness being equal to or larger than the depth of the recess portion in the stacked body, thereby preventing disconnection and cracking of the electrode. Further, the occurrence of stray capacitance between the shield layer formed on the inner bottom surface of the recess portion and the electrode is suppressed. In addition, it is possible to suppress the shield layer formed on the inner bottom surface of the recess portion from inhibiting the formation of magnetic flux of an inductor constituted by an inductor electrode formed inside the stacked body.

It is preferable that the thickness of the no-electrode region is twice or more as large as the depth of the recess portion starting from the inner bottom surface of the recess portion. In this case, disconnection or cracking in the electrode is further prevented. Furthermore, it is possible to more effectively suppress the occurrence of stray capacitance between the shield layer formed on the inner bottom surface of the recess portion and the electrode formed inside the stacked body. In addition, it is possible to further effectively suppress the shield layer formed on the inner bottom surface of the recess portion from inhibiting the formation of magnetic flux of the inductor constituted by the inductor electrode formed inside the stacked body.

It is more preferable that no electrode is formed underneath the inner bottom surface of the recess portion of the stacked body. In this case, in the region right below the inner bottom surface of the recess portion, it is possible to more effectively suppress the influence of the formation of the recess portion and the formation of the shield layer on the inner bottom surface thereof.

The stacked body extends along a plane in a longitudinal direction and a lateral direction, a size of the no-electrode region in the longitudinal direction is preferably set to be 1.5 times or more than a size of the recess portion in the longitudinal direction, and a size of the no-electrode region in the lateral direction is preferably set to be 1.5 times or more than a size of the recess portion in the lateral direction. In this case, it is possible to more effectively suppress the influence of the formation of the recess portion and the formation of the shield layer on the inner bottom surface thereof.

The electrode is, for example, an inductor electrode, a capacitor electrode, a wiring electrode, a ground electrode, or the like.

In the stacked electronic component of the present disclosure, at least one capacitor is constituted by a capacitor electrode formed in the stacked body, at least one inductor is constituted by an inductor electrode formed in the stacked body, and an LC filter circuit can be constituted by the capacitor and the inductor.

A manufacturing method of a stacked electronic component of the present disclosure includes: a step of preparing a plurality of ceramic green sheets; a step of forming a first paste-pattern by applying a first paste to one main surface or both main surfaces of at least one of the plurality of ceramic green sheets, the first paste being conductive; a step of producing an aggregate substrate shaped unfired stacked body by stacking a plurality of ceramic green sheets in a predetermined order; a step of applying a second paste to the upper surface of the aggregate substrate shaped unfired stacked body, thereby forming a second paste-pattern having a constant thickness and indicating at least one of a mark, a letter, or a number; a step of planarizing the upper surface of the aggregate substrate shaped unfired stacked body by pushing the second paste-pattern into the upper surface of the aggregate substrate shaped unfired stacked body; a step of cutting the aggregate substrate shaped unfired stacked body stacked body units; a step of firing one of the stacked body units in a predetermined profile and simultaneously losing the second paste-pattern, thereby producing a stacked body in which a plurality of ceramic layers are stacked, the stacked body having a bottom surface, an upper surface, a plurality of side surfaces connecting the bottom surface and the upper surface, and at least one recess portion formed on the upper surface; and a step of forming a shield layer on a side surface and the upper surface, the shield layer being formed on at least a portion of an inner bottom surface and an inner wall surface of the recess portion.

Further, instead of forming the second paste-pattern by applying a second paste to the upper surface of the aggregate substrate shaped unfired stacked body, it is possible to form the second paste-pattern by applying the second paste to an upper main surface of an uppermost one of the plurality of ceramic green sheets in advance.

The recess portion on the upper surface of the stacked body may be formed by irradiation with laser light, without using the second paste. Alternatively, the recess portion on the upper surface of the stacked body may be formed by pushing a convex portion formed on an inner upper surface of a mold, into the upper surface of the unfired stacked body, without using the second paste.

Further, in the stacked electronic component manufactured by the manufacturing method of a stacked electronic component of the present disclosure, it is preferable that a no-electrode region is formed right below the inner bottom surface of the recess portion of the stacked body, and it is preferable that the thickness of the no-electrode region has a size equal to or larger than the depth of the recess portion starting from the inner bottom surface of the recess portion. This is because it is possible to avoid disconnection or cracking in the electrode.

The stacked electronic component of the present disclosure suppresses the penetration of noise from the outside and the emission of noise to the outside, the indication of marks, letters, and numbers with high visibility is formed on the upper surface, and furthermore, suppress the occurrence of defective products.

According to the manufacturing method of a stacked electronic component of the present disclosure, the stacked electronic component of the present disclosure can be easily manufactured.

DETAILED DESCRIPTION OF THE DISCLOSURE

Figure 1:
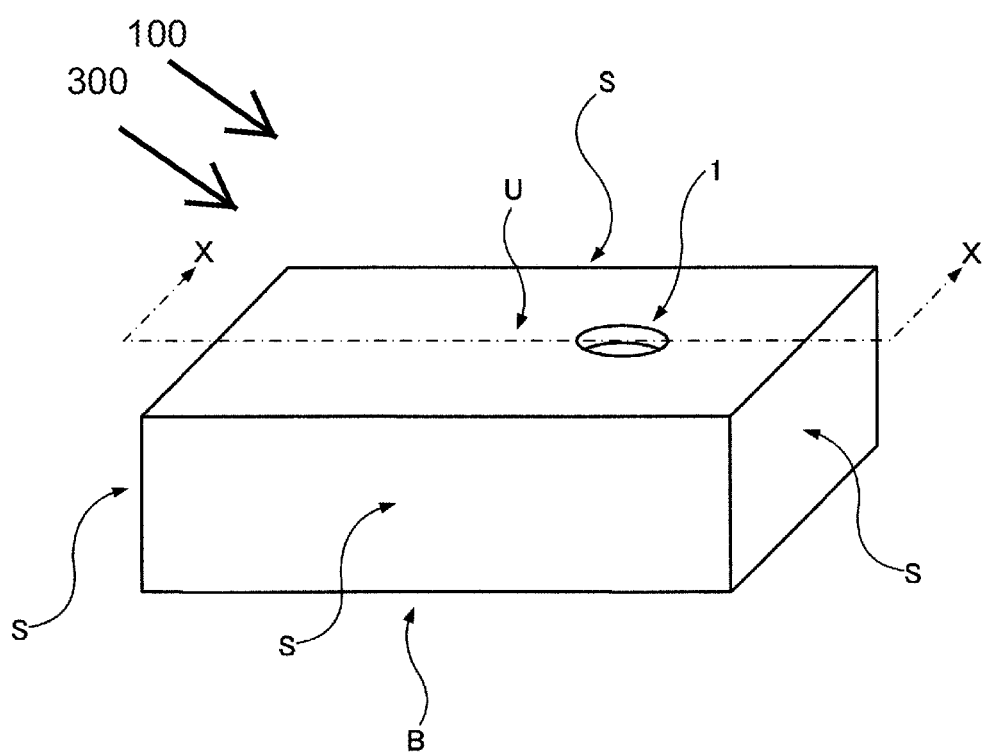
FIG. 1 is a perspective view showing a stacked electronic component 100 according to a first embodiment. Also, it is a perspective view showing a stacked electronic component 300 according to a third embodiment.

Hereinafter, embodiments for carrying out the present disclosure will be described with reference to the drawings. It should be noted that the embodiments are illustrative of the embodiments of the present disclosure, and the present disclosure is not limited to the disclosed the embodiments. It is also possible to combine different embodiments, and combined embodiments are included in the scope of the present disclosure. In addition, the drawings are intended to support understanding of the specification and may be schematically drawn, and there are cases in which the ratio of the dimensions of the drawn components or the ratio between the drawn components does not coincide with the ratio of the dimensions described in the specification. In addition, elements described in the specification may be omitted in the drawing, and steps illustrated in the drawings may be performed with certain elements in the drawings being omitted.

First Embodiment

Figure 2:
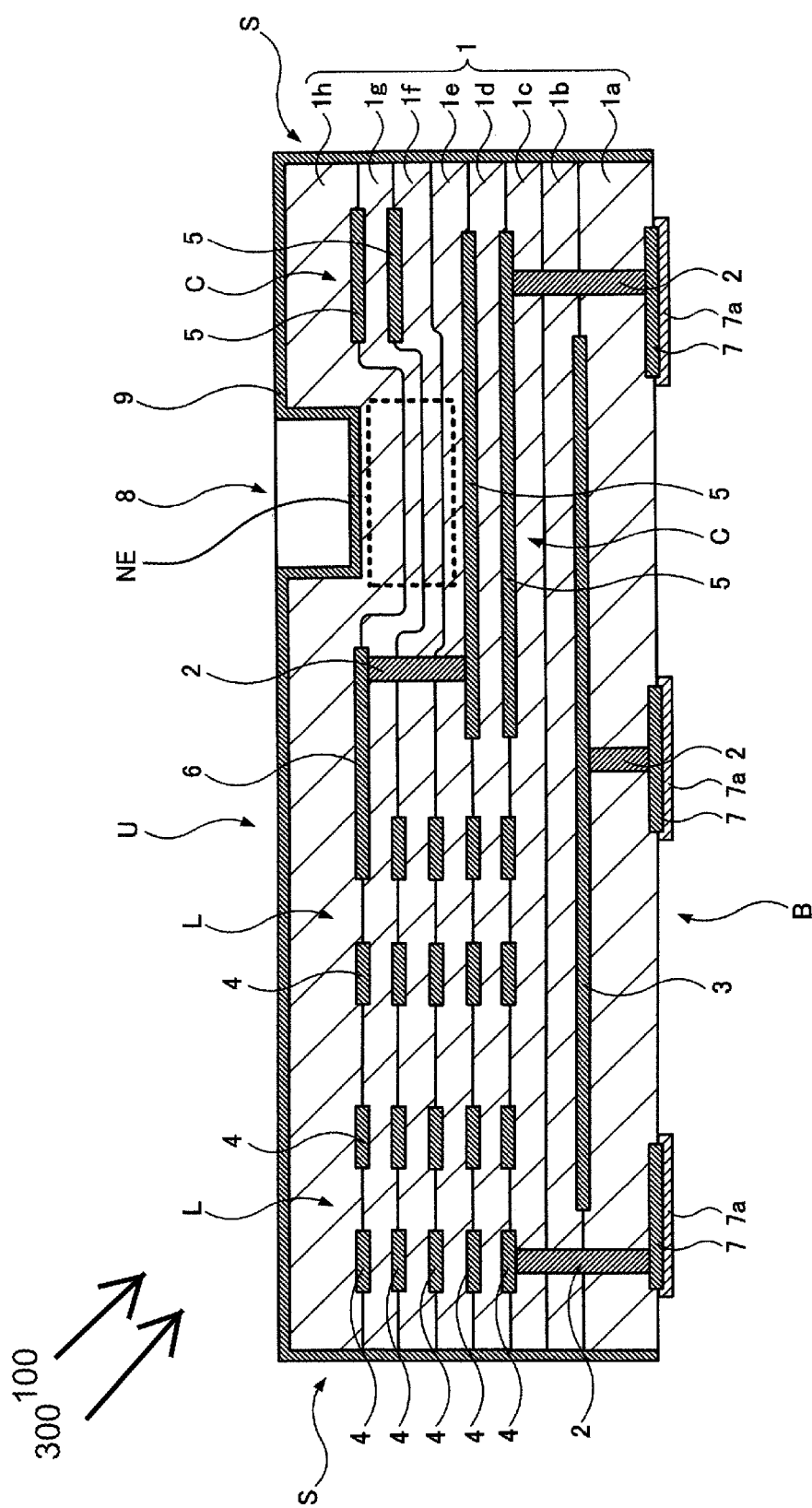
FIG. 2 is a cross-sectional view showing the stacked electronic component 100, and is also a cross-sectional view showing the stacked electronic component 300.

FIG. 1 and FIG. 2 show a stacked electronic component 100 according to a first embodiment. FIG. 1 is a perspective view of a stacked electronic component 100. FIG. 2 is a cross-sectional view of the stacked electronic component 100, and shows a portion indicated by a dot-dash line X-X in FIG. 1.

The stacked electronic component 100 is, for example, a stacked LC filter in which a capacitor and an inductor are formed inside and constitute a predetermined LC filter circuit. However, the type of the stacked electronic component 100 is not limited to the stacked LC filter.

The stacked electronic component 100 includes a stacked body 1 in which ceramic layers $1a$ to $1h$ are stacked. The stacked body 1 has a bottom surface B, an upper surface U and four side surfaces S connecting the bottom surface B and the upper surface U.

In the present embodiment, the thicknesses of the ceramic layer $1a$ and the ceramic layer $1h$, which are the protective layers, are each set to 20 μm. The thicknesses of the ceramic layers $1b$ to $1g$ stacked between the ceramic layers $1a$ and $1h$ are each set to 10 μm. However, the thicknesses and number of ceramic layers are optional and can be selected as required.

The ceramic layers $1a$ to $1h$ are provided with via electrodes 2 connecting upper and lower main surfaces.

A ground electrode 3, an inductor electrode 4, a capacitor electrode 5 and a wiring electrode 6 are formed between the ceramic layers $1a$ to $1h$.

A plurality of inductor electrodes 4 are connected in a spiral shape by a via conductor (not shown) to form an inductor L.

A capacitor C is formed by a pair of capacitor electrodes 5 facing each other.

The inductor L and the capacitor C are connected by a via electrode 2 and the wiring electrode 6 to form a predetermined LC filter circuit in the stacked body 1.

A plurality of external electrodes 7 are formed on the bottom surface B of the stacked body 1. A plating layer $7a$ is formed on a surface of each external electrode 7. Each of the external electrodes 7 is connected to a predetermined portion of the LC filter circuit.

A cylindrical shaped recess portion 8 is formed on the upper surface U of the stacked body 1. In the present embodiment, the recess portion 8 is a directional mark. In the present embodiment, the depth of the recess portion 8 is set to 20 μm. However, the recess portion 8 may have other depths. In one example, the depth of the recess portion 8 can be selected from the range of about 5 μm to 50 μm. Further, the deeper the depth, the higher the visibility of the recess portion 8 becomes, but it becomes difficult to form. The recess portion 8 is not limited to a mark such as a directional mark. The recess portion 8 may be a letter or a number such as, for example, a product number, a date of manufacture, a manufacturing factory, or the like.

In the present embodiment, the recess portion 8 is formed by pushing a paste into the upper surface of the unfired stacked body and then firing the stacked body to remove the paste, The ceramic layers $1e$, $1f$, $1g$, and $1h$ are plastically deformed toward the bottom surface B by being pushed by the recess portion 8 right below the inner bottom surface of the recess portion 8.

A shield layer 9 is formed on the upper surface U (including the inner bottom surface and the inner wall surface of the recess portion 8 of the stacked body 1) and on the four side surfaces S of the stacked body 1. The shield layer 9 is formed such that noise does not penetrate from the outside and noise is not emitted to the outside.

Right below the inner bottom surface of the recess portion 8 of the stacked body 1, a no-electrode region NE is provided in which no electrodes (e.g., the ground electrode 3, the inductor electrode 4, the capacitor electrode 5, and the wiring electrode 6) are formed. In the present embodiment, the thickness of the no-electrode region NE is set to 20 μm starting from the inner bottom surface of the recess portion 8. That is, the thickness of the no-electrode region NE is set to be the same as the depth of the recess portion 8. By forming the no-electrode region NE with the same thickness as the depth of the recess portion 8 right below the inner bottom surface of the recess portion 8, no disconnection or cracking occurs in the capacitor electrode 5 or the wiring electrode 6 right below the no-electrode region NE. It is also preferable that the thickness of the no-electrode region NE is twice or more as large as the depth of the recess portion 8 to suppress the disconnection and cracking more reliably.

The stacked body 1 extends along a horizontal plane in a longitudinal direction and a lateral direction. It is preferable that the no-electrode region NE is set to extend in the longitudinal direction by about 1.5 times or more than a size of the recess portion 8 in the longitudinal direction, and is set to extend in the lateral direction by about 1.5 times or more than a size of the recess portion in the lateral direction. This makes it possible to more effectively suppress the occurrence of disconnection or cracking in the electrodes such as the inductor electrode 4, the capacitor electrode 5, and the wiring electrode 6 in this case.

The stacked electronic component 100 of the first embodiment having the above structure has the following advantages.

First, since the stacked electronic component 100 has the shield layer 9 formed on the outer surface of the stacked body 1, the penetration of noise from the outside and the emission of noise to the outside are suppressed.

Since the stacked electronic component 100 has the recess portion 8 formed on the upper surface U of the stacked body 1 that indicates information by mark(s), letter(s) or number (s), shadows appear more clearly even from above the shield layer 9, and information can be recognized with high visibility.

In the stacked electronic component 100, since a no-electrode region NE having a thickness of 20 μm, which is the same as the depth of the recess portion 8, is formed right below the inner bottom surface of the recess portion 8 of the stacked body 1, the electrodes such as the ground electrode 3, the inductor electrode 4, the capacitor electrode 5, and the wiring electrode 6 are not disconnected or cracked. More specifically, as described above, by forming the recess portions 8, the ceramic layers $1e$, $1f$, $1g$, and $1h$ are plastically deformed toward the bottom surface B, right below the inner bottom surface of the recess portion 8. However, since the ceramic layer $1d$ is spaced away from the inner bottom surface of the recess portion 8 by forming the no-electrode region NE, the ceramic layer $1d$ is not plastically deformed. As a result, the capacitor electrode 5 formed between the ceramic layer $1d$ and the ceramic layer $1e$ is not plastically deformed, and no disconnection or cracking occurs.

In the stacked electronic component 100, since a no-electrode region NE having a thickness of 20 μm, which is the same as the depth of the recess portion 8, is formed right below the inner bottom surface of the recess portion 8 of the stacked body 1, occurrence of stray capacitance between a shield layer 9 formed on the inner bottom surface of the recess portion 8 and the electrodes such as ground electrode 3, inductor electrode 4, capacitor electrode 5 and wiring electrode 6, is suppressed.

In the stacked electronic component 100, the shield layer 9 formed on the inner bottom surface of the recess portion 8 is also suppressed from inhibiting the formation of magnetic flux of the inductor L constituted by the inductor electrode 4. That is, in the stacked electronic component, when a recess portion is formed on the upper surface of the stacked body, and when a shield layer is formed on the outer surface of the stacked body, the shield layer formed on the inner bottom surface of the recess portion can block the magnetic flux constituted by the inductor electrode formed inside the stacked body, and can cause a problem wherein electrical characteristics cannot be obtained since the Q value of the inductor can be lowered or the inductance value of the inductor can be lowered. However, in the stacked electronic component 100, since a no-electrode region NE having a thickness of 20 μm, which is the same as the depth of the recess portion 8, is formed right below the inner bottom surface of the recess portion 8 of the stacked body 1, the shield layer 9 formed on the inner bottom surface of the recess portion 8 is suppressed from inhibiting the formation of magnetic flux of the inductor L constituted by the inductor electrode 4.

The stacked electronic component 100 can be manufactured, for example, by a method shown in FIGS. 3A to 3K.

First, ceramic slurry is prepared. Specifically, ceramic slurry is prepared by mixing a ceramic powder, binder and plasticizer in a predetermined amount.

Then, the ceramic slurry is coated on the carrier film to produce a ceramic green sheet. A lip coater, a doctor blade, or the like can be used for applying the slurry.

Figure 3A:
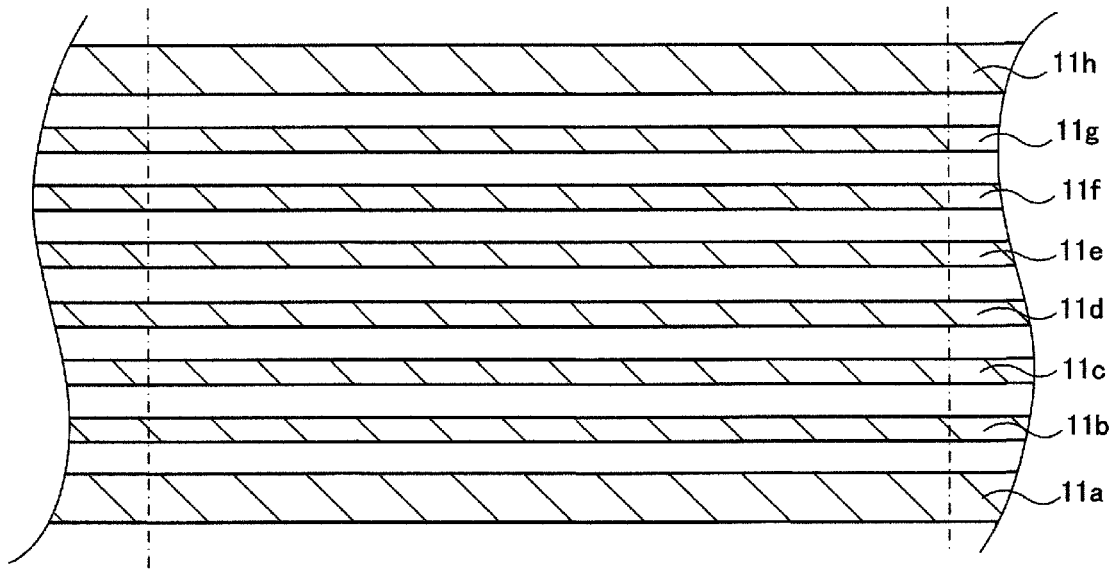
FIG. 3A to FIG. 3K are cross-sectional views showing successive steps performed in an example manufacturing method of the stacked electronic component 100.

As shown in FIG. 3A, ceramic green sheets are prepared as mother ceramic green sheets 11a to 11h in which a plurality of ceramic green sheets are arranged in a matrix in order to collectively form a plurality of stacked electronic components 100.

Figure 3B:
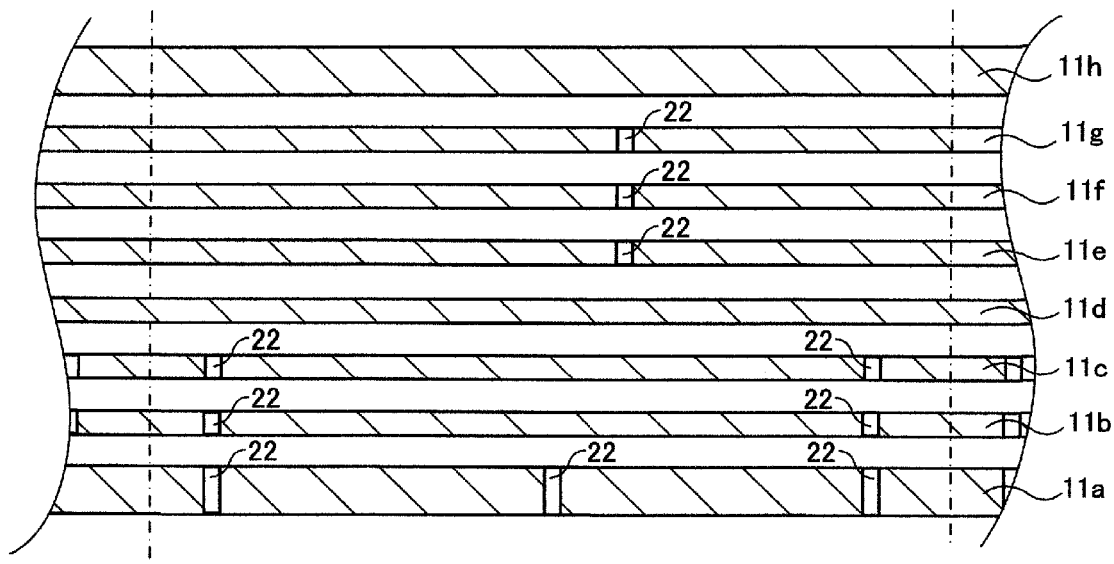

Then, as shown in FIG. 3B, through-holes 22 for forming via electrodes 2 are formed in the ceramic green sheets 11a to 11h. The diameter of the through-hole 22 can vary but is, for example, 20 μm to 200 μm. The formation of the through-hole 22 may be performed by a mechanical punch, irradiation of $CO_2$ laser light, irradiation of UV laser light, or the like.

Subsequently, a conductive paste is produced. Specifically, the conductive paste is prepared by mixing conductive powder, binder, and plasticizer in a predetermined amount. A shared base (ceramic powder) for adjusting the shrinkage ratio may be added to the conductive paste.

Figure 3C:
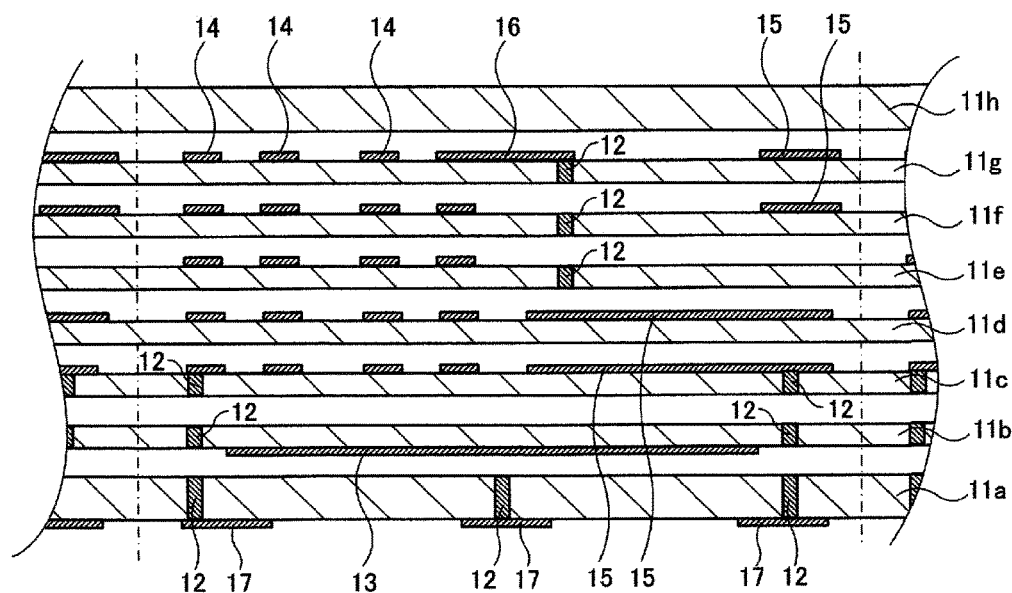

Then, as shown in FIG. 3C, a conductive paste-pattern 13 for forming the ground electrode 3, a conductive paste-pattern 14 for forming the inductor electrode 4, a conductive paste-pattern 15 for forming the capacitor electrode 5, a conductive paste-pattern 16 for forming the wiring electrodes 6, and a conductive paste-pattern 17 for forming the external electrodes 7 are formed filling the through-holes 22 of the ceramic green sheets 11a to 11h with the conductive paste 12, and applying the conductive paste to the main surface of the ceramic green sheets 11a to 11h.

Figure 3D:
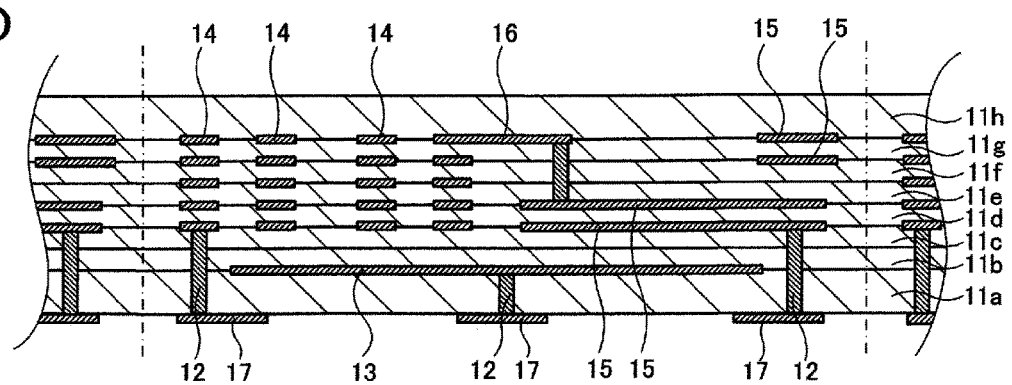

Then, as shown in FIG. 3D, the ceramic green sheets 11a to 11h are stacked.

Figure 3E:
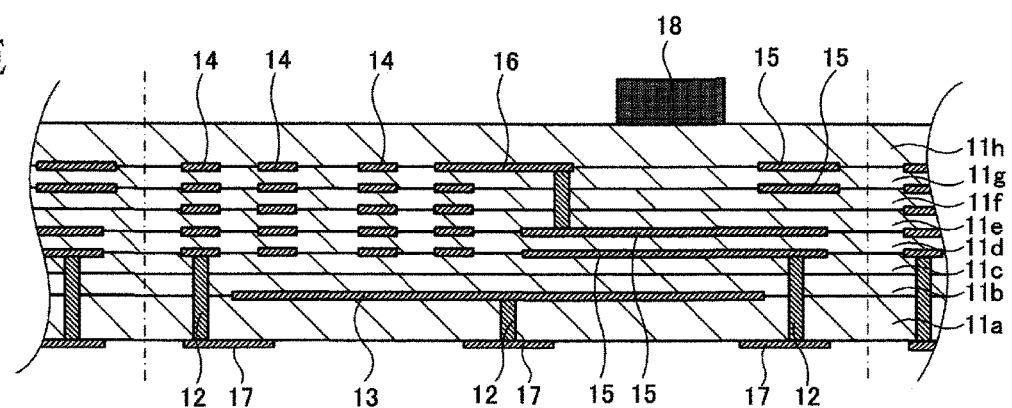

Then, as shown in FIG. 3E, a paste-pattern 18 is formed on the upper surface of the ceramic green sheet 11h to form the recess portion 8. The material of the paste-pattern 18 may be any material that disappears by firing. For example, resin or carbon may be used. The paste-pattern 18 may be formed by, for example, inkjet or transfer. The thickness of the paste-pattern 18 is set to be slightly larger than the depth of the recess portion 8.

In some examples, instead of forming the paste-pattern 18 on the upper surface (upper main surface) of the ceramic green sheet 11h after the ceramic green sheets 11a to 11h are stacked, the paste-pattern 18 may be formed on the upper main surface of the ceramic green sheet 11h before stacking the ceramic green sheets 11a to 11h.

Figure 3F:
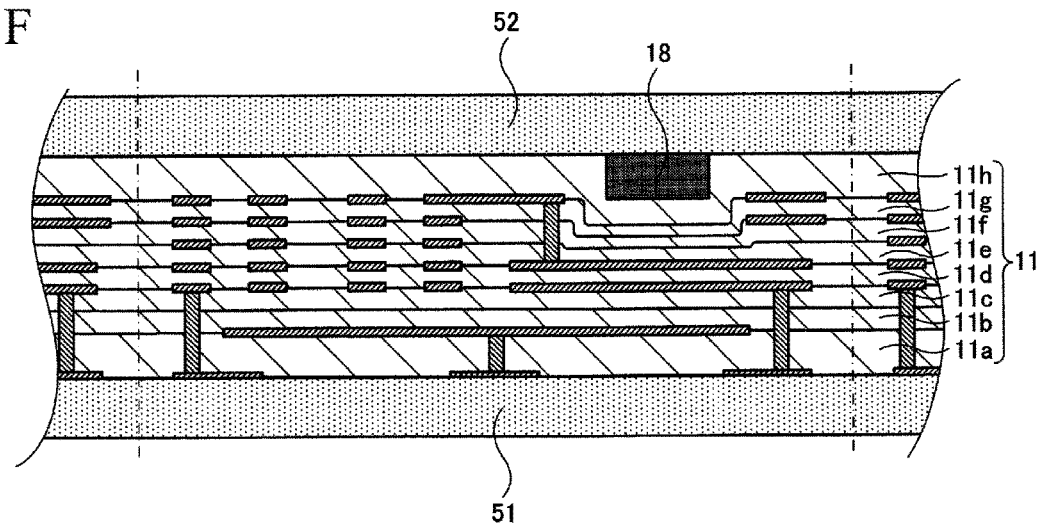

Subsequently, as shown in FIG. 3F, the ceramic green sheets 11a to 11h are sandwiched between a lower mold 51 and an upper mold 52 and heated and pressed from the upper and lower sides to be integrated to form an aggregate substrate shaped unfired stacked body 11. At this time, since the inner upper surface of the upper mold 52 is flat, the paste-pattern 18 is pushed into the upper surface of the aggregate substrate shaped unfired stacked body 11.

Figure 3G:
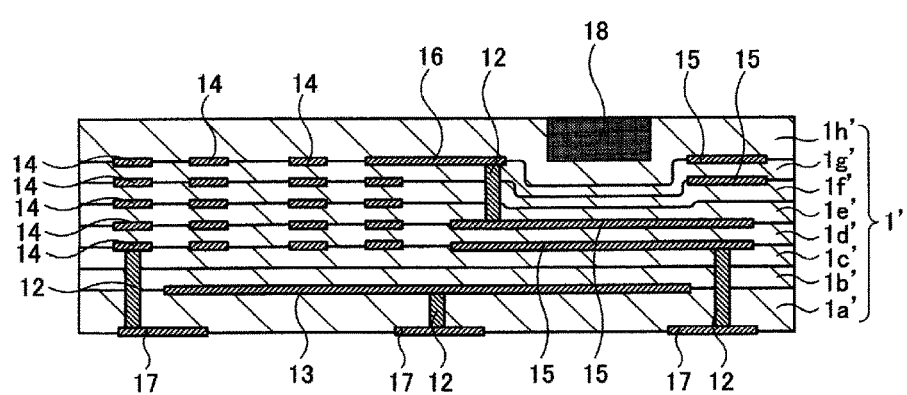

Subsequently, as shown in FIG. 3G, the aggregate substrate shaped unfired stacked body 11 is cut into individual unfired stacked bodies 1', and then separated. Each unfired stacked body 1' is formed by stack of ceramic green sheets 1a' to 1h'.

Figure 3H:
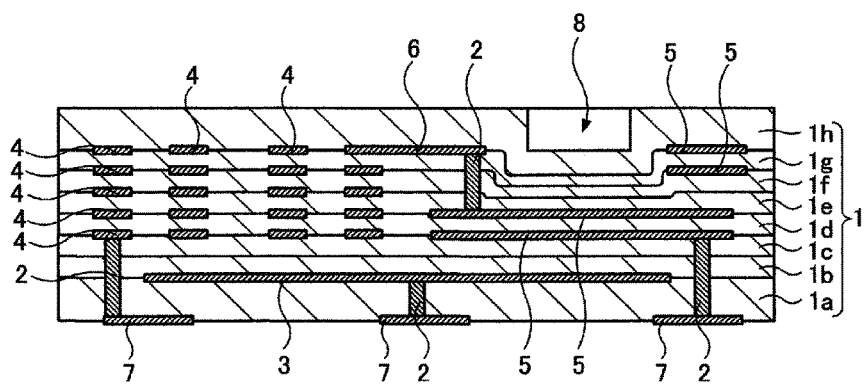

Then, as shown in FIG. 3H, the unfired stacked body 1' is fired in a predetermined profile. As a result, the unfired stacked body 1' in which the ceramic green sheets 1a' to 1h' are stacked is fired to become a stacked body 1 in which the ceramic layers 1a to 1h are stacked. The conductive paste 12 filled in each through-hole 22 is fired to become the via electrode 2. The conductive paste-pattern 13 is fired to become the ground electrode 3. The conductive paste-pattern 14 is fired to become the inductor electrode 4. The conductive paste-pattern 15 is fired to become the capacitor electrode 5. The conductive paste-pattern 16 is fired to become the wiring electrode 6. The conductive paste-pattern 17 is fired to become the external electrode 7. In addition, the paste-pattern 18 pushed into the upper surface of the unfired stacked body 1' is fired and disappears, and the recess portion 8 is formed on the upper surface of the stacked body 1.

A batch furnace, a belt furnace, or the like can be used for firing the unfired stacked body 1'. When a Cu-based conductive paste is used, it can be fired in a reducing atmosphere.

Figure 3I:
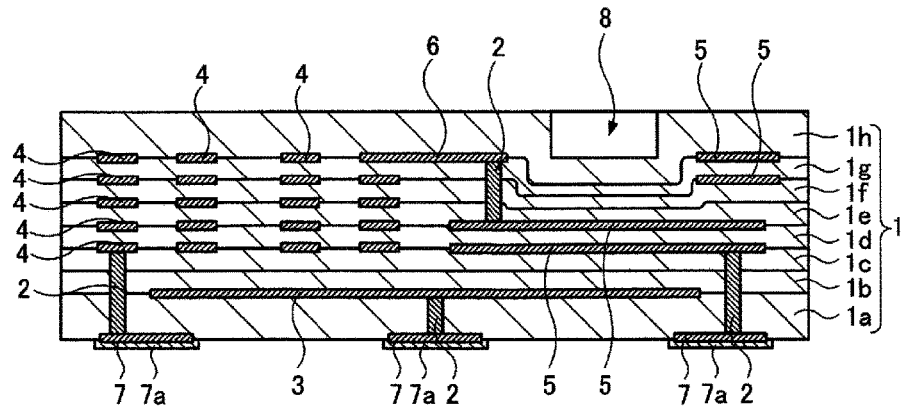

Subsequently, as shown in FIG. 3I, a plating layer 7a is formed on the surface of each external electrode 7. The material and the number of layers of the plating layer 7a can vary. For example, the first layer may be a Ni plating layer and the second layer may be a Sn plating layer formed by electrolytic plating. Alternatively, an Au plating layer may be formed by electroless plating.

Figure 3J:
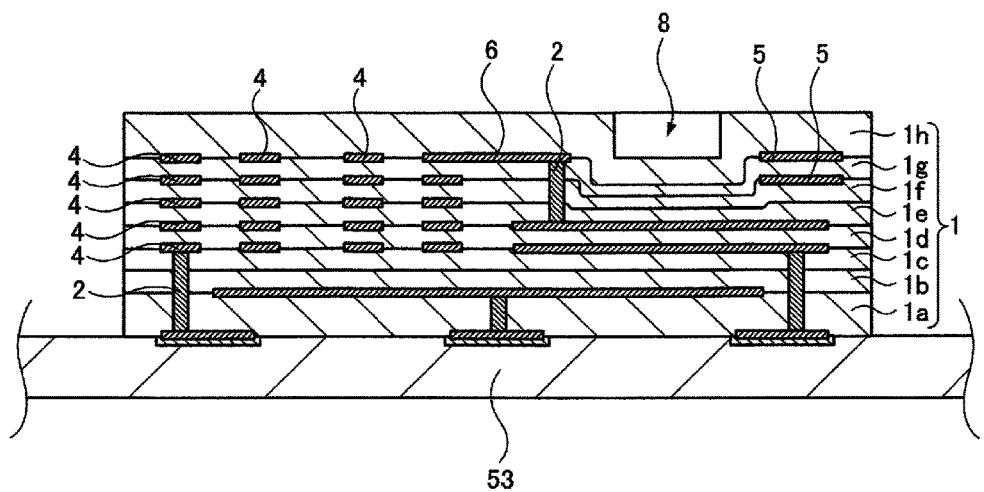

Subsequently, as shown in FIG. 3J, the stacked body 1 is fixed to a fixing jig 53 having adhesiveness on the upper main surface thereof.

Figure 3K:
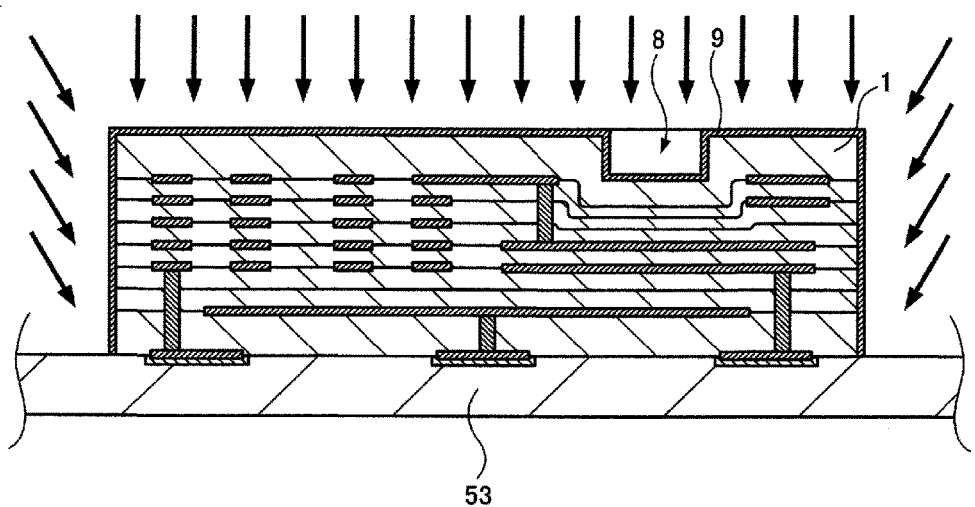

Subsequently, as shown in FIG. 3K, a shield layer 9 is formed on the outer surface of the stacked body 1 by sputtering. In some examples, plasma cleaning is performed on the outer surface of the stacked body 1 before sputtering. The shield layer 9 is formed on the inner bottom surface and the inner wall surface of the recess portion 8. The shield layer 9 includes three layers in the order of, for example, an adhesion layer, a conductive layer and a protective layer. However, the adhesion layer may be omitted if adhesion with the stacked body 1 made of ceramic is sufficient. SUS, Ti, Cr, Ni or the like can be used as the material of the adhesion layer and the protective layer, for example. Cu, Ag, Al or the like can be used as the material of the conductive layer, for example. An in-line type, a batch type, a sheet-fed type, or the like can be used as the sputtering equipment, for example.

In the present embodiment, the formation of the shield layer 9 is performed by sputtering. However, the shield layer 9 may be formed by spin coating. In such cases, the resin paste containing the conductive powder can be attached to the outer surface of the stacked body 1 by way of a spin coat. Further, the outer surface of the stacked body 1 may be plasma-cleaned before spin-coating.

Thus, the stacked electronic component 100 according to the first embodiment is completed.

Second Embodiment

Figure 4:
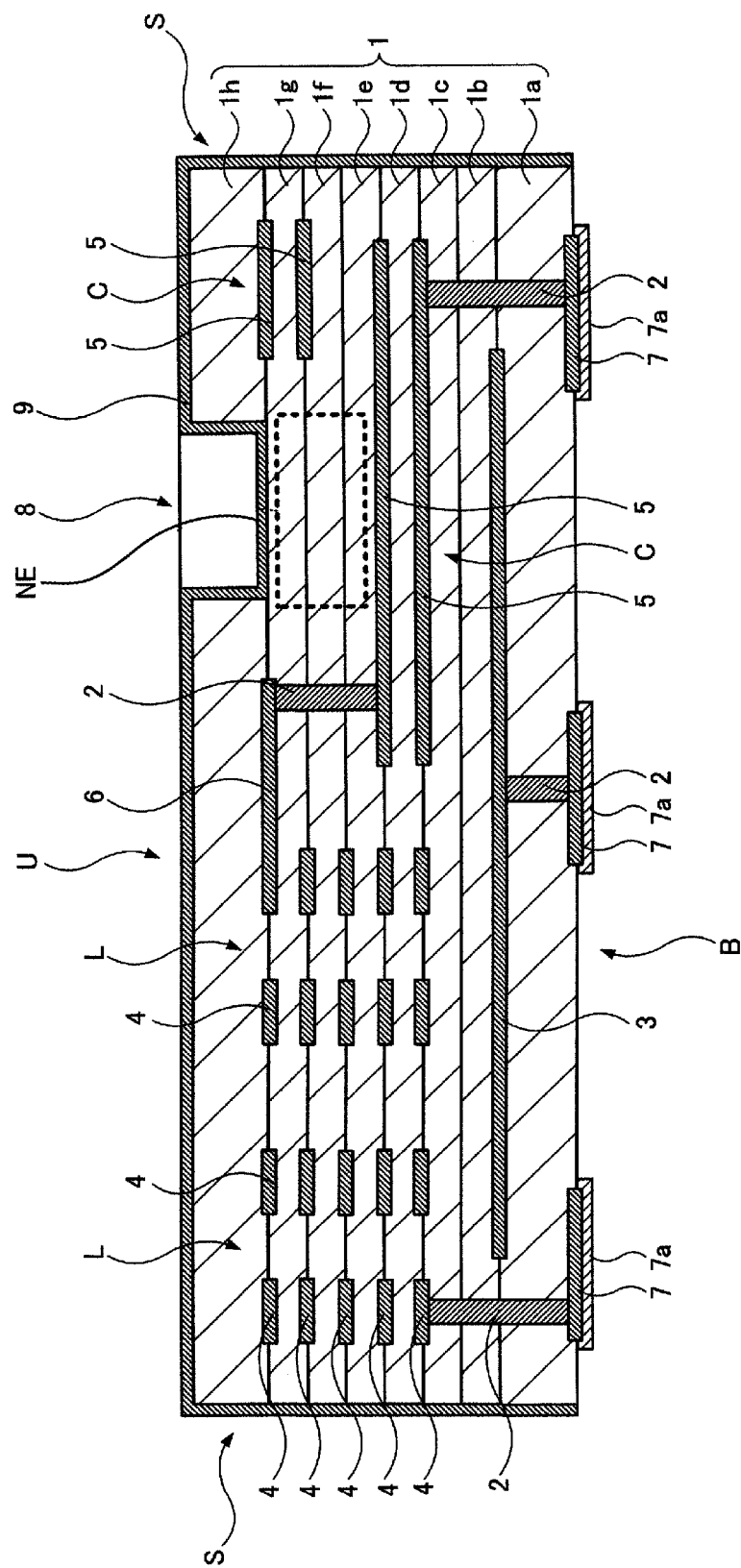
FIG. 4 is a cross-sectional view showing a stacked electronic component 200 according to a second embodiment.

FIG. 4 shows a stacked electronic component 200 according to a second embodiment. FIG. 4 is a cross-sectional view of the stacked electronic component 200.

The manufacturing method of the stacked electronic component 200 is partially changed from the manufacturing method of the stacked electronic component 100 according to the first embodiment described above. Specifically, in the first embodiment, the paste-pattern 18 is pushed into the upper surface of the aggregate substrate shaped unfired stacked body 11 and the paste-pattern 18 disappears during firing so that the recess portion 8 is formed. In the second embodiment, the recess portion 8 is formed by irradiating laser light on the upper surface of the aggregate substrate shaped unfired stacked body 11. Other manufacturing steps of the stacked electronic component 200 are the same as that of the first embodiment.

By adopting the above manufacturing method, the ceramic layers 1e, 1f, 1g, and 1h are not plastically deformed right below the inner bottom surface of the recess portion 8, as shown in FIG. 4.

Additionally, since the no-electrode region NE having the same thickness as the depth of the recess portion 8 (20 μm) is formed right below the inner bottom surface of the recess portion 8 in the stacked electronic component 200, disconnection or crack of the electrodes (such as the capacitor electrode 5) formed right below the inner bottom surface of the recess portion 8 due to the heat of laser light does not occur. Further, the occurrence of stray capacitance between the shield layer 9 formed on the inner bottom surface of the recess portion 8 and the electrode formed inside the stacked body is suppressed. Also, the shield layer 9 formed on the inner bottom surface of the recess portion 8 is suppressed from inhibiting the magnetic flux formation of the inductor L constituted by the inductor electrode 4.

Third Embodiment

The stacked electronic component 300 according to the third embodiment is manufactured. Since the stacked electronic component 300 has the same structure as the stacked electronic component 100 according to the first embodiment shown in FIGS. 1 and 2, the description will be made with reference to FIGS. 1 and 2.

The manufacturing method of the stacked electronic component 300 is also partially changed from the manufacturing method of the stacked electronic component 100 according to the first embodiment described above. Specifically, in the first embodiment, the paste-pattern 18 is pushed into the upper surface of the aggregate substrate shaped unfired stacked body 11 and the paste-pattern 18 is lost during firing so that the recess portion 8 is formed. In the third embodiment, the recess portion 8 is formed by pushing a convex portion formed on an inner bottom surface of an upper mold (not shown) into the upper surface of the aggregate substrate shaped unfired stacked body 11. Other manufacturing steps of the stacked electronic component 300 are the same as that of the first embodiment.

In the stacked electronic component 300, like the stacked electronic component 100, disconnection or crack of the electrodes (such as the ground electrode 3, inductor electrode 4, capacitor electrode 5, and wiring electrode 6) formed inside the stacked body 1 is inhibited. Further, the occurrence of the stray capacitance is suppressed, and the inhibition of the magnetic flux formation of the inductor is suppressed.

Fourth Embodiment

Figure 5:
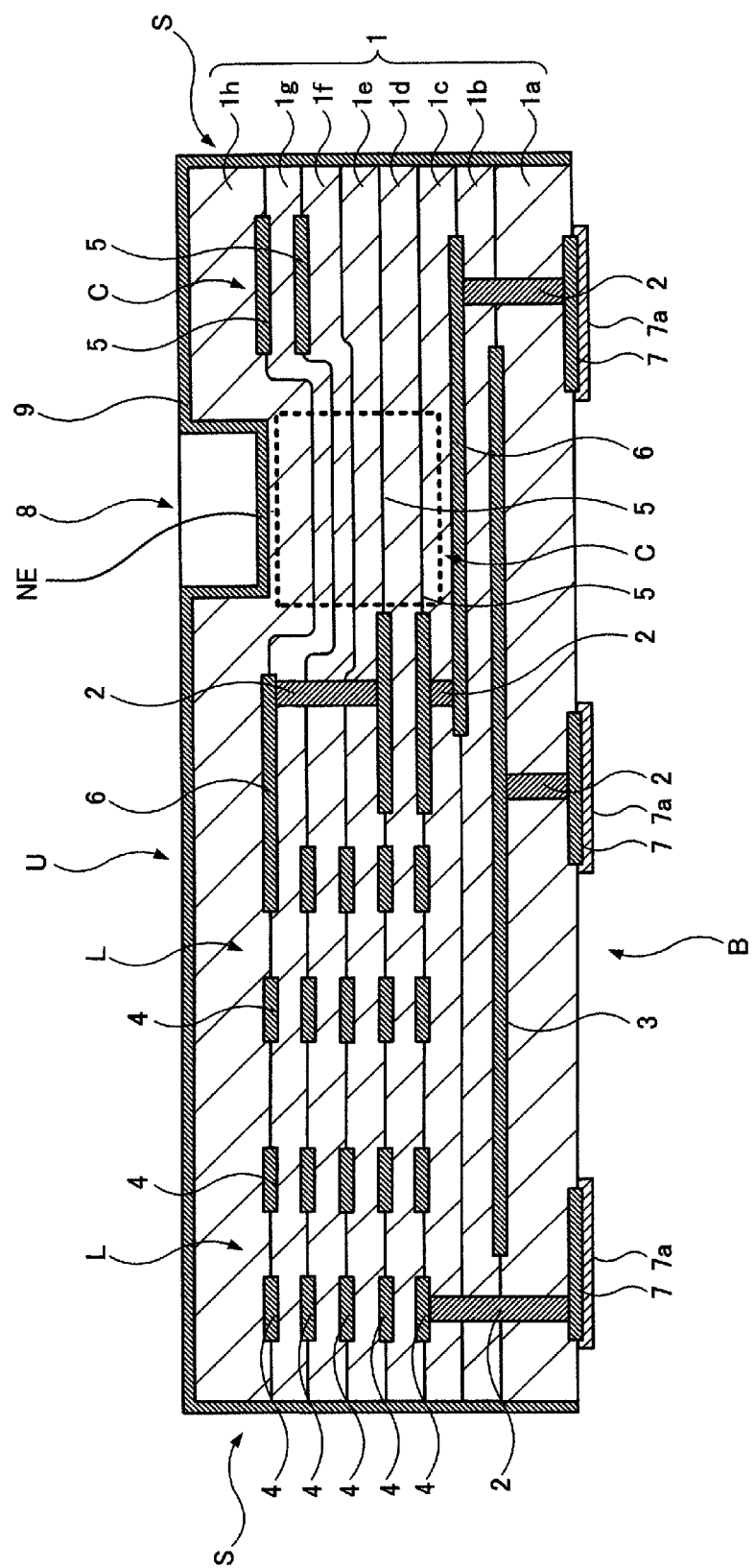
FIG. 5 is a cross-sectional view showing a stacked electronic component 400 according to a fourth embodiment.

FIG. 5 shows a stacked electronic component 400 according to the fourth embodiment. FIG. 5 is a cross-sectional view of the stacked electronic component 400.

The stacked electronic component 400 has been modified in part of the structure of the stacked electronic component 100 according to the first embodiment. Specifically, in the stacked electronic component 100, the no-electrode region NE formed right below the inner bottom surface of the recess portion has the same thickness as the depth of the recess portion 8 (20 μm). In the stacked electronic component 400, an no-electrode region NE having a thickness as twice as large as the depth of the recess portion 8 (40 μm) is formed right below the inner bottom surface of the recess portion 8. The content and arrangement of the LC filter circuit formed inside the stacked body 1 is changed accordingly.

Disconnection or crack of the electrode (such as wiring electrode 6) is less likely to occur right below the inner bottom surface of the recess portion 8 for the stacked electronic component 400, as compared with the stacked electronic component 100. Furthermore, the occurrence of stray capacitance between the shield layer 9 formed on the inner bottom surface of the recess portion 8 and the electrode formed inside the stacked body, is more effectively suppressed. Also, the shield layer 9 formed on the inner bottom surface of the recess portion 8 is more effectively suppressed from inhibiting the magnetic flux formation of the inductor L constituted by the inductor electrode 4.

Fifth Embodiment

Figure 6:
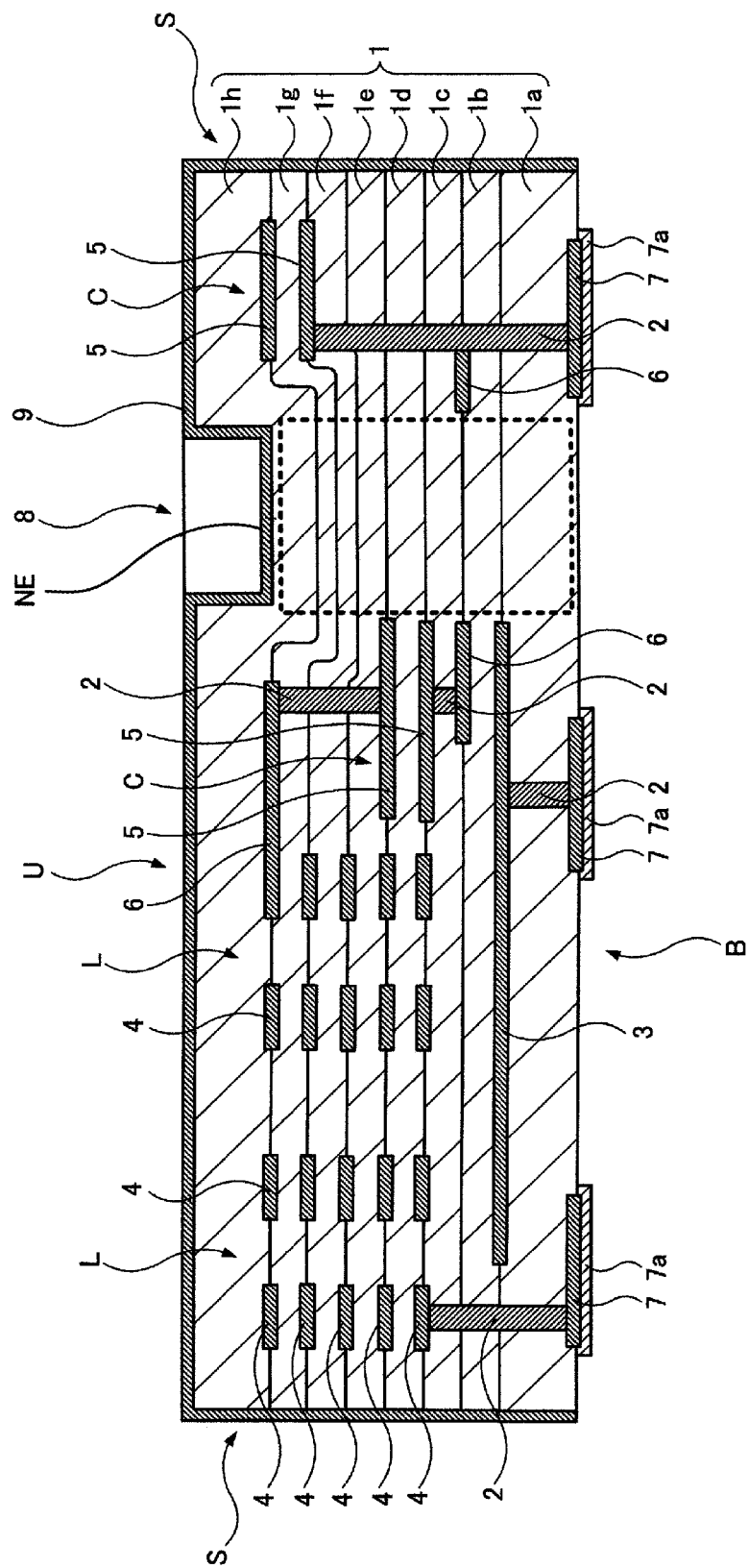
FIG. 6 is a cross-sectional view showing a stacked electronic component 500 according to a fifth embodiment.
Figure 7:
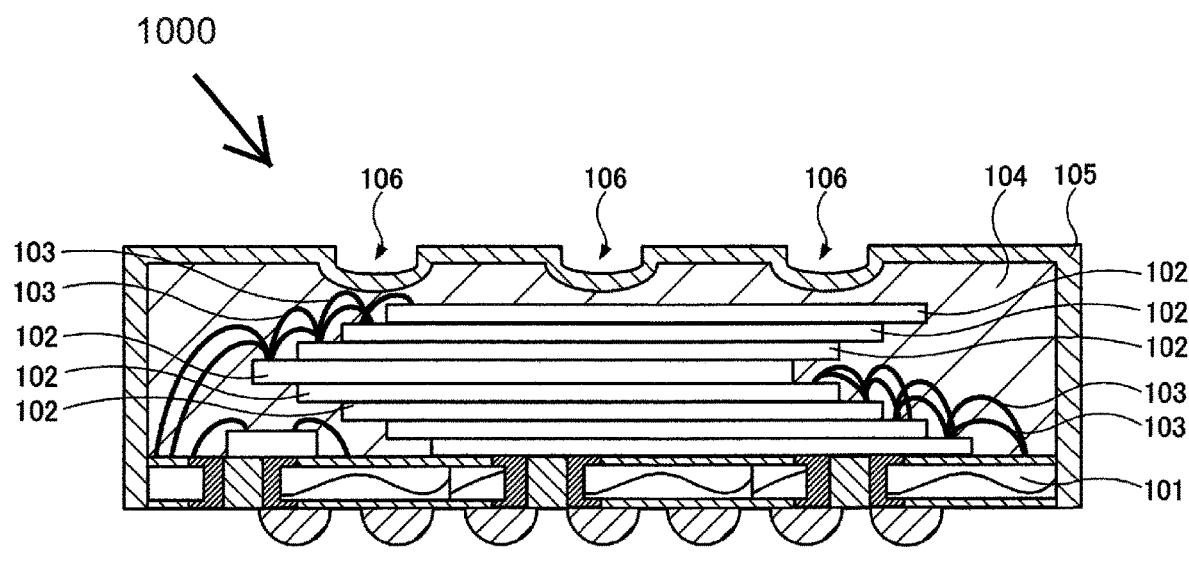
FIG. 7 is a cross-sectional view showing an electronic component module 1000 of the prior art.

FIG. 6 shows a stacked electronic component 500 according to the fifth embodiment. FIG. 6 is a cross-sectional view of the stacked electronic component 500.

The stacked electronic component 500 further includes modifications to the stacked electronic component 400 according to the fourth embodiment. More specifically, in the stacked electronic component 500, no electrode is formed right below the inner bottom surface of the recess portion 8, and a no-electrode region NE is formed that extends from the inner bottom surface of the recess portion 8 to the bottom surface B of the stacked body 1. The content and arrangement of the LC filter circuit formed inside the stacked body 1 is changed accordingly.

In the stacked electronic component 500, influences of forming the recess portion 8 and forming the shield layer 9 on the inner bottom surface of the recess portion 8, such as the disconnection or crack of the electrodes and the occurrence of stray capacitance between the shield layer 9 and the electrodes, are more effectively suppressed.

The stacked electronic components 100, 200, 300, 400, and 500 according to the first to fifth embodiments have been described above. However, the present disclosure is not limited to the above-described disclosure, and various modifications can be made in accordance with the gist of the disclosure.

For example, the stacked electronic components 100, 200, 300, 400, and 500 are stacked LC filters in which LC filter circuit formed inside the stacked body 1, but the type of the stacked electronic components is optional, and not limited to the stacked LC filters.

In the stacked electronic components 100, 200, 300, 400, and 500, the recess portion 8 is a mark (directional mark), but the recess portion 8 is not limited to a mark, and may include letters or numbers to indicate a product number, a date of manufacture, a manufacturing factory, or the like.

What is claimed is:

1. A stacked electronic component comprising:
    a stacked body in which a plurality of ceramic layers are stacked, the stacked body having a bottom surface, an upper surface, and a plurality of side surfaces connecting the bottom surface and the upper surface;
    a recess portion indicating at least one of a mark, letter, or number, the recess portion formed on the upper surface of the stacked body;
    an electrode;
    a shield layer formed on at least a portion of the side surface and at least a portion of the upper surface, the shield layer being formed on at least a portion of an inner bottom surface and an inner wall surface of the recess portion; and
    a no-electrode region provided below the inner bottom surface of the recess portion,
    wherein no electrode is formed in the no-electrode region,
    wherein a thickness of the no-electrode region is set to be equal to or larger than a depth of the recess portion, the thickness being measured from the inner bottom surface of the recess portion,
    wherein at least two layers of the plurality of ceramic layers extend through the no-electrode region, adjacent to the inner bottom surface of the recess portion, and
    wherein the electrode is formed between the at least two layers and outside of the no-electrode region.

2. The stacked electronic component according to claim 1, wherein no electrode is formed underneath the inner bottom surface of the recess portion of the stacked body.

3. The stacked electronic component according to claim 2, wherein the electrode comprises at least one of an inductor electrode, a capacitor electrode, a wiring electrode, or a ground electrode.

4. The stacked electronic component according to claim 1, wherein the stacked body extends along a plane in a longitudinal direction and a lateral direction, a size of the no-electrode region in the longitudinal direction is 1.5 times or more than a size of the recess portion in the longitudinal direction, and a size of the no-electrode region in the lateral direction is 1.5 times or more than a size of the recess portion in the lateral direction, respectively.

5. The stacked electronic component according to claim 1, wherein the electrode comprises at least one of an inductor electrode, a capacitor electrode, a wiring electrode, or a ground electrode.

6. The stacked electronic component according to claim 5, further comprising an LC filter circuit including at least one capacitor and at least one inductor, the at least one capacitor including the capacitor electrode, and the least one inductor including the inductor electrode.

7. A method of manufacturing the stacked electronic component according to claim 1, comprising:
    a step of preparing a plurality of ceramic green sheets;
    a step of forming a first paste-pattern by applying a first paste to one main surface or both main surfaces of at least one of the plurality of ceramic green sheets, the first paste being conductive;
    a step of producing an aggregate substrate shaped unfired stacked body by stacking a plurality of ceramic green sheets in a predetermined order;
    a step of applying a second paste to an upper surface of the aggregate substrate shaped unfired stacked body, thereby forming a second paste-pattern having a constant thickness and indicating at least one of the mark, the letter, or the number;
    a step of planarizing the upper surface of the aggregate substrate shaped unfired stacked body by pushing the second paste-pattern into the upper surface of the aggregate substrate shaped unfired stacked body;
    a step of cutting the aggregate substrate shaped unfired stacked body into stacked body units;
    a step of firing one of the stacked body units in a predetermined profile and simultaneously losing the second paste-pattern, thereby producing the stacked body in which the plurality of ceramic layers are stacked, and the recess portion formed on the upper surface; and
    a step of forming the shield layer,
    thereby producing the stacked electronic component.

8. A method of manufacturing the stacked electronic component according to claim 1, comprising:
    a step of preparing a plurality of ceramic green sheets;
    a step of forming a first paste-pattern by applying a first paste to one main surface or both main surfaces of at least one of the plurality of ceramic green sheets, the first paste being conductive;
    a step of applying a second paste to an upper main surface of an uppermost one of the plurality of ceramic green sheets, thereby forming a second paste-pattern having a constant thickness that indicates at least one of the mark, the letter, or the number;
    a step of producing an aggregate substrate shaped unfired stacked body by stacking the plurality of ceramic green sheets in a predetermined order;
    a step of planarizing an upper surface of the aggregate substrate shaped unfired stacked body by pushing the second paste-pattern into the upper surface of the aggregate substrate shaped unfired stacked body;
    a step of cutting the aggregate substrate shaped unfired stacked body into stacked body units;
    a step of firing one of the stacked body units in a predetermined profile and simultaneously losing the second paste-pattern, thereby producing the stacked body in which the plurality of ceramic layers are stacked, and the recess portion formed on the upper surface; and
    a step of forming the shield layer,
    thereby producing the stacked electronic component.

9. A method of manufacturing the stacked electronic component according to claim 1, comprising:
- a step of preparing a plurality of ceramic green sheets;
- a step of forming a paste-pattern by applying conductive paste to one main surface or both main surfaces of at least one of the plurality of ceramic green sheets;
- a step of producing an aggregate substrate shaped unfired stacked body by stacking the plurality of ceramic green sheets in a predetermined order;
- a step of forming the recess portion by irradiating an upper surface of the aggregate substrate shaped unfired stacked body with a laser light;
- a step of cutting the aggregate substrate shaped unfired stacked body into stacked body units;
- a step of firing a stacked body unit in a predetermined profile, thereby producing the stacked body in which the plurality of ceramic layers are stacked, the stacked; and
- a step of forming the shield layer, thereby producing the stacked electronic component.

10. A method of manufacturing the stacked electronic component according to claim 1, comprising:
- a step of preparing a plurality of ceramic green sheets;
- a step of forming a paste-pattern by applying a conductive paste to one main surface or both main surfaces of at least one of the plurality of ceramic green sheets;
- a step of producing an aggregate substrate shaped unfired stacked body by stacking the plurality of ceramic green sheets in a predetermined order;
- a step of forming the recess portion by pushing a convex portion on an inner upper surface of a mold toward an upper surface of the aggregate substrate shaped unfired stacked body;
- a step of cutting the aggregate substrate shaped unfired stacked body into stacked body units;
- a step of firing the one of the stacked body units in a predetermined profile, thereby producing the stacked body in which the plurality of ceramic layers are stacked; and
- a step of forming the shield layer, thereby producing the stacked electronic component.

11. The stacked electronic component according to claim 1, wherein the thickness of the no-electrode region is twice or more as large as the depth of the recess portion.

12. The stacked electronic component according to claim 11, wherein no electrode is formed underneath the inner bottom surface of the recess portion of the stacked body.

13. The stacked electronic component according to claim 11, wherein the electrode comprises at least one of an inductor electrode, a capacitor electrode, a wiring electrode, or a ground electrode.

14. A stacked electronic component comprising:
- a stacked body in which a plurality of ceramic layers are stacked, the stacked body having a bottom surface, an upper surface, and a plurality of side surfaces connecting the bottom surface and the upper surface;
- a recess portion indicating at least one of a mark, letter, or number, the recess portion formed on the upper surface of the stacked body;
- a shield layer formed on at least a portion of an inner bottom surface and an inner wall surface of the recess portion;
- a no-electrode region provided below the inner bottom surface of the recess portion, wherein no electrode is formed in the no-electrode region;
- an electrode formed between the ceramic layers of the stacked body in a region other than the no-electrode region, wherein a thickness of the no-electrode region is set to be equal to or larger than a depth of the recess portion, the thickness being measured from the inner bottom surface of the recess portion.

15. The stacked electronic component according to claim 14, wherein at least two layers of the plurality of ceramic layers extend through the no-electrode region, adjacent to the inner bottom surface of the recess portion, and wherein the electrode is formed between the at least two layers and outside of the no-electrode region.

* * * * *